United States Patent

Szu

[11] Patent Number: 6,152,757
[45] Date of Patent: Nov. 28, 2000

[54] ELECTRICAL CONNECTOR

[75] Inventor: Ming-Lun Szu, Taipei, Taiwan

[73] Assignee: Hon Hai Precision Ind. Co., Ltd., Taipei Hsien, Taiwan

[21] Appl. No.: 09/378,390

[22] Filed: Aug. 20, 1999

[30] Foreign Application Priority Data

May 15, 1999 [TW] Taiwan ................................. 88207775

[51] Int. Cl.$^7$ ................................................ H01R 13/625
[52] U.S. Cl. ............................................................ 439/342
[58] Field of Search ............................ 439/342, 259–270

[56] References Cited

U.S. PATENT DOCUMENTS

| | | | |
|---|---|---|---|
| 5,057,031 | 10/1991 | Sinclair | 439/342 |
| 5,562,474 | 10/1996 | Lee | 439/342 |
| 5,791,929 | 8/1998 | Banakis et al. | 439/342 |
| 5,947,778 | 9/1999 | Lai et al. | 439/342 |

*Primary Examiner*—Gary F. Paumen
*Attorney, Agent, or Firm*—Wei Te Chung

[57] ABSTRACT

An electrical connector comprises a base defining a plurality of elongate channels and a plurality of alternating first and second cavities in each channel, a cover movably attached to the base and a plurality of first and second contacts respectively received in the first and second cavities of the base. Each contact comprises a retention portion, a spring arm extending from one edge of the retention portion, and a mounting portion laterally extending from an opposite edge of the retention portion. The spring arm forms an engaging portion at a free end thereof comprising first and second connecting portions deflecting from a plane of the retention portion. The contacts are assembled to the base with the engaging portions of the adjacent contacts being offset a distance smaller than a dimension of a pin of an electronic chip, causing alternating contacts to electrically engage with alternating pins on opposite sides thereof.

10 Claims, 7 Drawing Sheets

ELECTRICAL CONNECTOR

BACKGROUND OF THE INVENTION

The present invention relates to a connector, and especially to a zero insertion force connector.

U.S. Pat. Nos. 3,676,832; 4,498,725; 4,750,891; 4,988,310; and 5,057,031 and Taiwan patent application Nos. 83208396, 83214436, 83203222, 82208450 and 82214129 disclose zero insertion force connectors. Referring to FIGS. 1 and 2, a conventional connector 6 comprises a base 61 having a plurality of contact receiving cavities 611, a cover 62 movably mounted on the base 61, a plurality of contacts 63 received in the cavities 611, and a cam mechanism 64. Each cavity 611 has a wide end 6111 and a narrow end 6112. When the cover 62 is positioned at an open position, each pin 7 of an electronic component (not shown) is positioned in the wide end 6111 and is not engaged with an engaging portion 631 of the contact 63. After the cover 62 is positioned at a closed position, each pin 7 is positioned in the narrow end 6112 and is connected with each engaging portion 631 and a side wall 610 of each cavity 611 on opposite sides thereof. However, when the pins 7 are driven from the wide ends 6111 to the narrow ends 6112, each pin 7 scrapes the engaging portion 631 of the contact 63 and the side wall 610 of the cavity 611 on opposite sides thereof, thus, a force required to drive the pins 7 is significant. Additionally, the pins 7 are likely to become disengaged from the engaging portions 631 since the pin 7 engages with the engaging portion 631 in a plane parallel to a direction in which the pin 7 moves. Hence, an improved electrical connector is required to overcome the disadvantages of the prior art.

BRIEF SUMMARY OF THE INVENTION

A first object of the present invention is to provide a zero insertion force connector having a base and a cover, the cover being driven along the base from an open state to a closed state at a low external force.

A second object of the present invention is to provide a zero insertion force connector having a plurality of contacts received therein in a high density arrangement.

Accordingly, an electrical connector comprises a base, a first group of contacts and a second group of contacts retained in the base and a cover movably mounted on the base. The base defines a plurality of elongate channels in a top face thereof and a plurality of alternating first and second cavities in each elongate channel. Each first cavity in a selected channel is offset a distance from the proximate second cavity in the same channel in a direction perpendicular to the direction that the cover moves along the base. Each contact comprises a retention portion and an engaging tab. The first and the second contacts are respectively received in the first and the second cavities with the engaging tabs extending out of the cavities to be within corresponding channels. The cover defines a plurality of apertures adapted for reception of pins of a chip electrically connected with the electrical connector. The engaging tabs of the contacts received in the first and the second cavities of one selected channel solely engage with corresponding pins of the chip on opposite sides of the pins. Each contact has one area connecting with one associated pin.

Each channel forms a pair of opposite peripheral walls in the elongate direction thereof. Each of the first and the second cavities comprises a peripheral fence proximate a corresponding peripheral wall of the channel. The retention portions of the contacts are close to the peripheral fence of the first and second cavities. The peripheral walls are distanced from corresponding pins of the chip except for the pins on far left and right sides of the chip. Thus, the force to drive the cover along the base is low.

Other objects, advantages and novel features of the invention will become more apparent from the following detailed description of the present embodiment when taken in conjunction with the accompanying drawings.

DETAILED DESCRIPTION OF THE INVENTION

Figure 1:
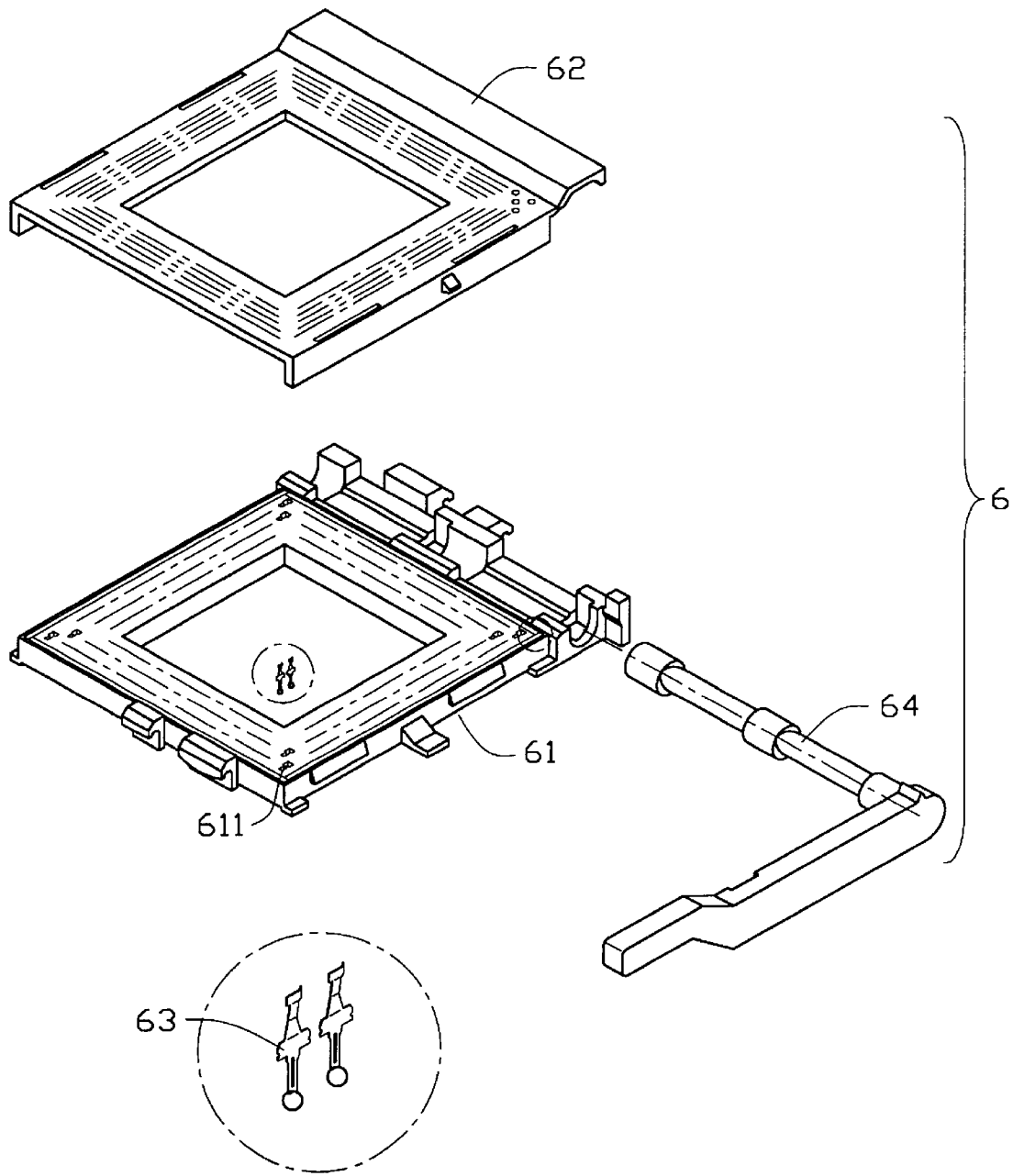
FIG. 1 is an exploded view of a conventional ZIF connector.
Figure 2:
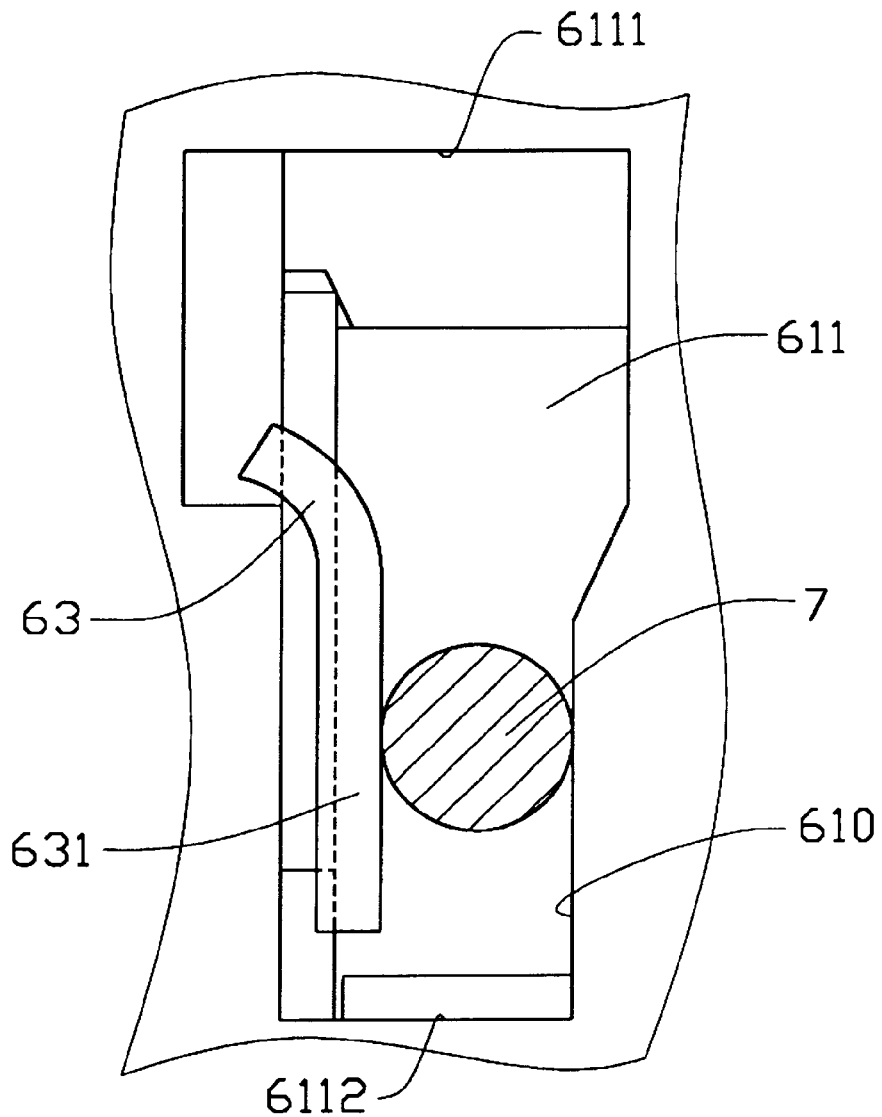
FIG. 2 is a partial top view of the assembled connector of FIG. 1 with a cover of the connector removed therefrom to clearly show engagement of a contact of the connector with a pin of a chip.
Figure 3:
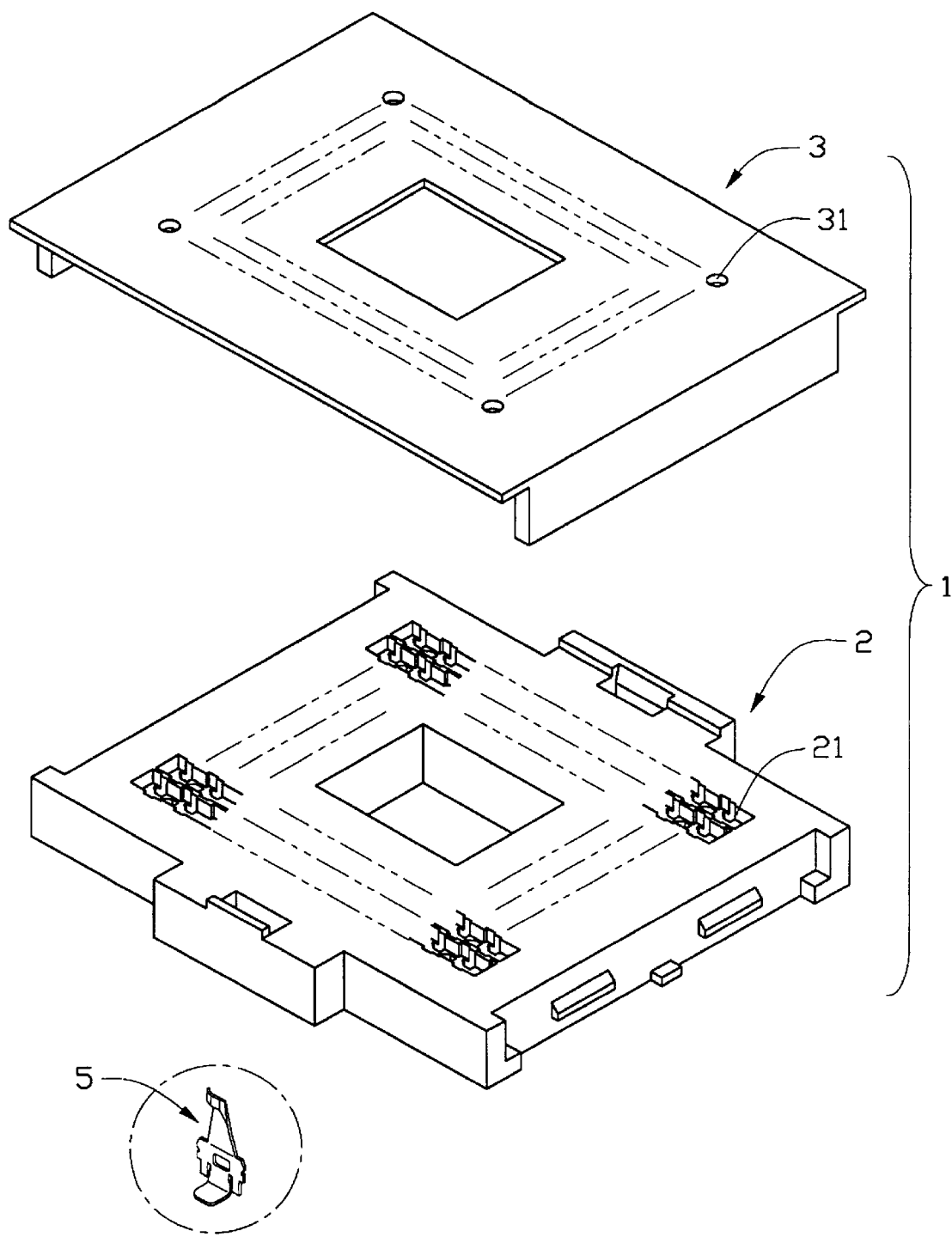
FIG. 3 is an exploded view of a ZIF connector in accordance with the present invention.

Referring to FIG. 3, a ZIF connector 1 comprises a base 2, a cover 3 movably mounted on the base 2 and a plurality of contacts 5 received in the base 2. The cover 3 defines a plurality of apertures 31 corresponding to the contacts 5 in the base 2 through which pins 7 (FIG. 6) of a chip (not shown) extend to electrically engage with the contacts 5. The cover 3 together with the chip is movable along the base 2 in predetermined directions to engage/disengage the pins 7 with/from the contacts 5.

Figure 4:
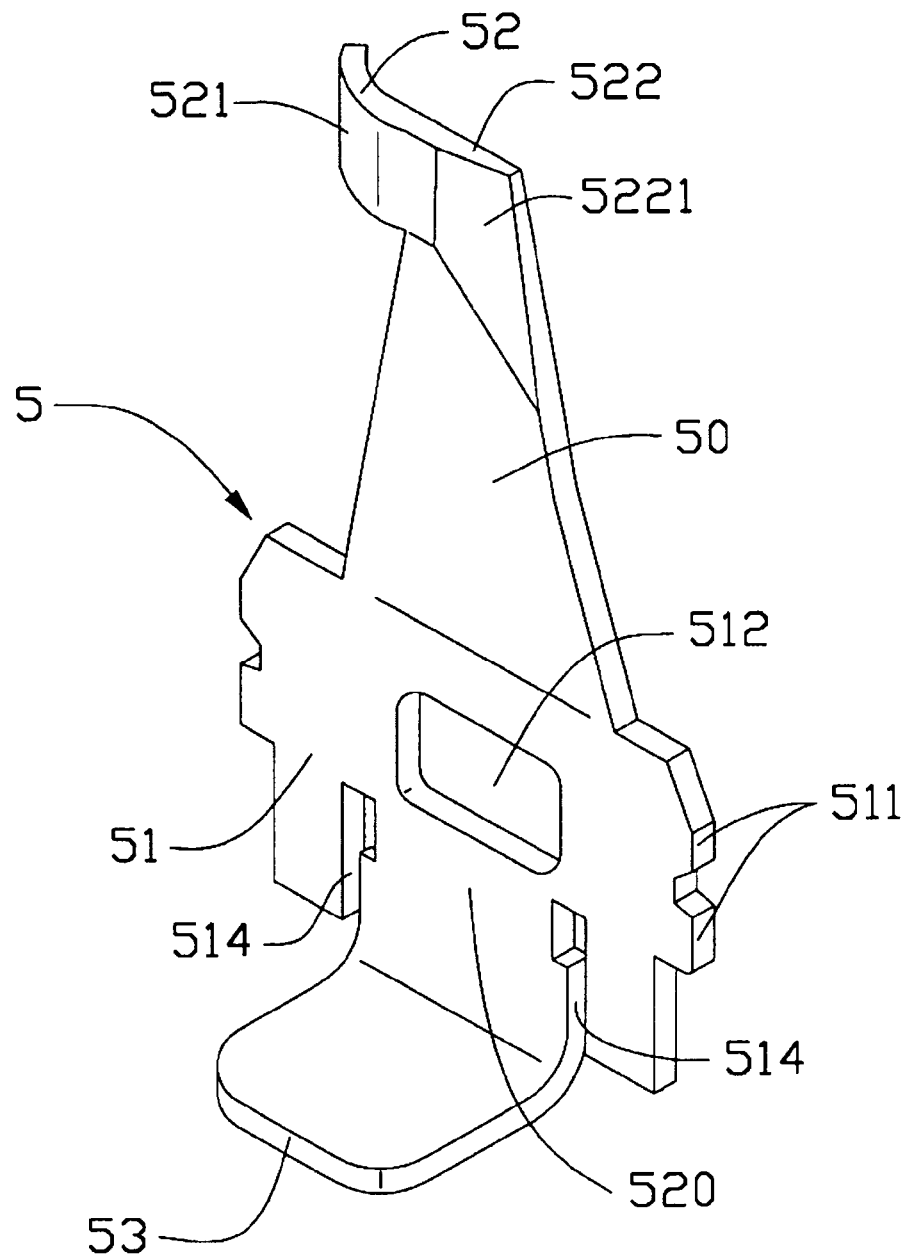
FIG. 4 is a perspective view of a contact of FIG. 3.

Referring to FIG. 4, each contact 5 comprises a retention portion 51 forming a pair of barbs 511 on each side edge thereof, a spring arm 50 upwardly extending from a top edge thereof and a mounting portion 53 laterally extending from a bottom edge thereof. The spring arm 50 forms a piece of engaging tab 52 at a free end thereof for electrically engaging the pin 7. The engaging tab 52 comprises a first connecting portion 521 and a second connecting portion 522. The first connecting portion 521 is laterally bent to deflect from a plane of the retention portion 51 for facilitating engagement with the pin 7. The second connecting portion 522 is coined to form an incline 5221 for preventing automatic disengagement from the pin 7 (described in detail hereinafter). The retention portion 51 comprises a tongue portion 520 and a pair of gaps 514 is defined proximate opposite edges of the tongue portion 520 to provide the tongue portion 520 with resiliency. The retention portion 51 further defines a chamber 512 above the tongue 520 to further increase the resiliency of the tongue portion 520. Thus, after the mounting portion 53 of each contact 5 is mounted on a printed circuit board (not shown), a shear force can develop between the contacts 5 and the printed circuit board due to different coefficients of thermal expansion between the base 2 and the printed circuit board. However, the flexibility of the tongue 520 helps the contact to withstand the strain.

Figure 5:
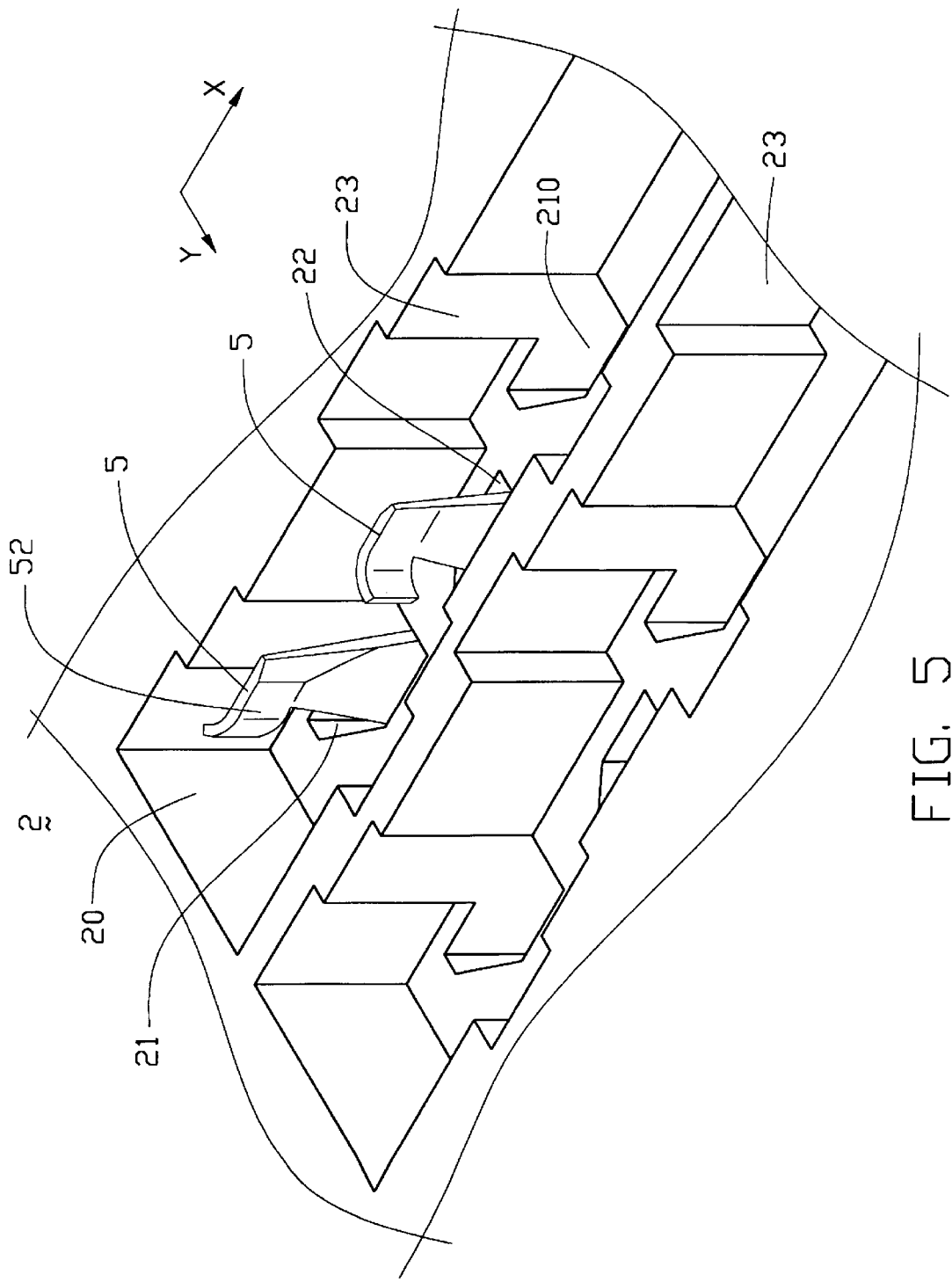
FIG. 5 is a partial perspective view of a base of the connector of FIG. 3 with a pair of contacts received therein.
Figure 6:
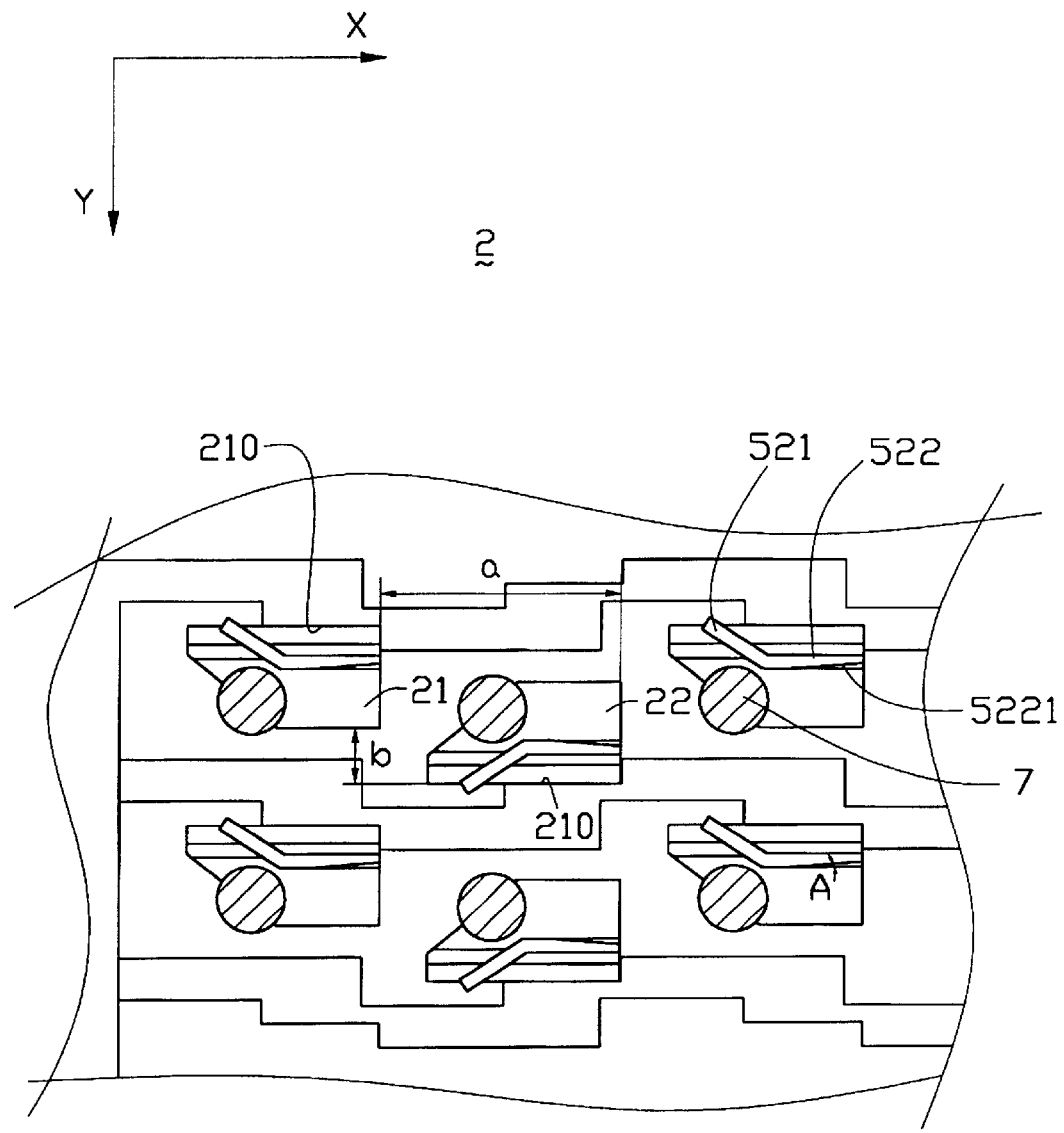
FIG. 6 is a partial top view of the assembled connector of FIG. 3 with a cover of the connector removed therefrom and the pins of the chip disengaged from the contacts of the connector.
Figure 7:
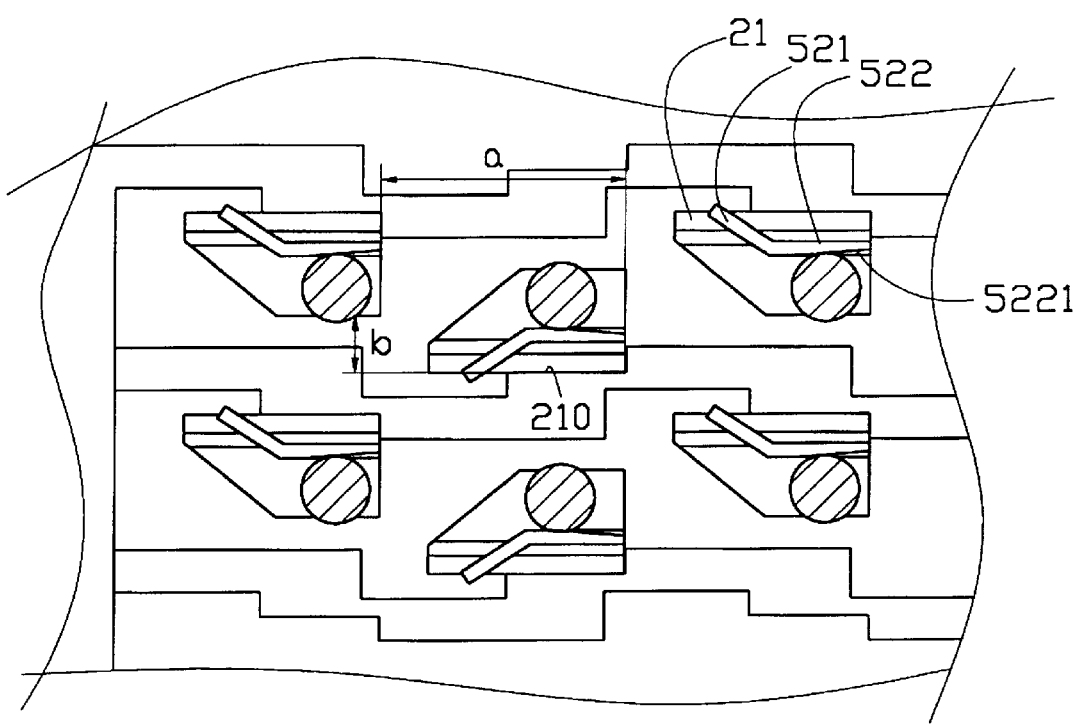
FIG. 7 is a view similar to FIG. 6 but the pins of the chip are engaged with the contacts of the connector.

Referring to FIGS. 5–7, the cover 3 is movable along the base 2 in a direction "X". A direction "Y" is defined to be perpendicular to the "X" direction. The base 2 defines a plurality of elongate channels 20 in a top face thereof and a plurality of alternating first and second cavities 21, 22 in each elongate channel 20. Each first cavity 21 is offset a distance of "a" in the "X" direction and a distance of "b" in the "Y" direction from a proximate second cavity 22. Each elongate channel 20 comprises a pair of opposite peripheral walls 23 and each of the first and second cavities 21, 22 comprises a peripheral fence 210 proximate the peripheral wall 23. The retention portions 51 of the contacts 5 are secured in the cavities 21, 22 close to the peripheral fence 210. The distance in the "Y" direction between the engaging tabs 52 of two adjacent contacts 5 received in the first cavities 21 and the second cavities 22 is smaller than a dimension of the pin 7. Thus, when the pins 7 are driven to engage with the contacts 5, the pins 7 solely abut against the first connecting portions 521 of the contacts 5 received in the first and second cavities 21, 22 in opposite directions. Each contact 5 is initially connected with its associated pin 7 at the contact's first connecting portion 521. The pins 7 then slide to abut against the second connecting portions 522 and establish reliable engagement therebetween. The pins 7 will not become automatically disengaged from the engaging tabs 52 due to the inclines 5221 which prevent a rearward movement of the pins 7 from the engaging tabs 52. The peripheral walls 23 are distanced from corresponding pins 7 of the chip except for the pins 7 on far left and right sides of the chip. Thus, the force to drive the cover 3 along the base 2 is low.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for engaging with a chip having a plurality of pins, comprising:

a base defining a plurality of elongate channels in a top face thereof and a plurality of alternating first and second cavities in each elongate channel;

a first group of contacts and a second group of contacts received in the first and the second cavities, respectively, each contact comprising a retention portion and an engaging tab, the engaging tabs extending out of the cavities to be within corresponding ones of the channels, the engaging tabs of the contacts being adapted to singly engage with a corresponding pin of the chip in the channels; and a cover defining a plurality of apertures adapted for reception of the pins of the chip, the cover being attached to the base and being movable along the base in a predetermined direction;

wherein the contacts of the first and second groups are adapted to alternatingly urge the corresponding pins in opposite directions so as to balance forces applied on the chip.

2. The electrical connector as claimed in claim 1, wherein each channel forms a pair of opposite peripheral walls in the elongate direction thereof, and wherein the first and second cavities are respectively proximate the opposite peripheral walls.

3. The electrical connector as claimed in claim 2, wherein each of the first and second cavities comprises a peripheral fence proximate a corresponding peripheral wall of the channel.

4. The electrical connector as claimed in claim 3, wherein the retention portions of the contacts are close to the peripheral fence of the first and second cavities.

5. The electrical connector as claimed in claim 2, wherein each contact has one area connecting with an associated pin.

6. The electrical connector as claimed in claim 2, wherein the peripheral walls are distanced from corresponding pins of the chip except for the pins on far left and right sides of the chip.

7. The electrical connector as claimed in claim 1, wherein each first cavity in a selected channel is offset a distance from the proximate second cavity in the same channel in a direction perpendicular to the direction that the cover moves along the base.

8. The electrical connector as claimed in claim 1, wherein the engaging tabs of the contacts received in the first and second cavities of one selected channel solely engage with corresponding pins of the chip in opposite sides of the pins.

9. The electrical connector as claimed in claim 1, wherein the engaging tab of each contact comprises a coined contact surface for positioning a corresponding pin.

10. An electrical connector assembly, comprising:

a base defining a plurality of first and second cavities in first rows, said first and said second cavities alternately arranged in each of said first rows, said first and second cavities being of mirror image with each other along a center line of each of said first rows;

a plurality of contacts respectively positioned within the corresponding first and second cavities in each of said first rows, said contacts being arranged in alternate manner in said first and second cavities to be of mirror image alternately along the same center line; and a chip including a plurality of pins extending downwardly in second rows, said pins of each of said second rows received within the corresponding first and second cavities in each of said first rows along said center line, each of said pins only engaging the corresponding contacts, respectively, without touching the housing, wherein the contacts in said first and second cavities along said center line alternately urge the corresponding contacts, respectively, in opposite directions so as to balance forces applied on the chip.

* * * * *